United States Patent
Asanao

(10) Patent No.: US 10,615,121 B2
(45) Date of Patent: Apr. 7, 2020

(54) SEMICONDUCTOR DEVICE HAVING A REDUCED PITCH BETWEEN LEAD-OUT WIRINGS

(71) Applicant: PS4 Luxco S.a.r.l., Luxembourg (LU)

(72) Inventor: Shunsuke Asanao, Tokyo (JP)

(73) Assignee: LONGITUDE LICENSING LIMITED, Dublin (IE)

( * ) Notice: Subject to any disclaimer, the term of this patent is extended or adjusted under 35 U.S.C. 154(b) by 152 days.

(21) Appl. No.: 14/781,378

(22) PCT Filed: Apr. 8, 2014

(86) PCT No.: PCT/JP2014/060144
§ 371 (c)(1),
(2) Date: Sep. 30, 2015

(87) PCT Pub. No.: WO2014/168130
PCT Pub. Date: Oct. 16, 2014

(65) Prior Publication Data
US 2016/0043031 A1    Feb. 11, 2016

(30) Foreign Application Priority Data
Apr. 9, 2013 (JP) .................................. 2013-081409

(51) Int. Cl.
*H01L 23/528* (2006.01)
*H01L 23/522* (2006.01)
(Continued)

(52) U.S. Cl.
CPC .......... *H01L 23/528* (2013.01); *H01L 23/522* (2013.01); *H01L 21/0274* (2013.01); *H01L 21/0337* (2013.01); *H01L 2924/0002* (2013.01)

(58) Field of Classification Search
CPC ......... H01L 2924/0002; H01L 2924/00; H01L 21/0337; H01L 21/32139; H01L 21/0338;
(Continued)

(56) References Cited

U.S. PATENT DOCUMENTS 6,660,462 B1    12/2003  Fukuda
8,448,102 B2 *   5/2013  Kornachuk ......... G06F 17/5068
                                                         716/55
(Continued)

FOREIGN PATENT DOCUMENTS

| JP | 11150243 | 2/1999 |
| JP | 2008218573 | 9/2008 |
| JP | 2012060142 | 3/2012 |

OTHER PUBLICATIONS

Application No. PCT/JP2014/060144, International Search Report, dated Jul. 22, 2014.

*Primary Examiner* — David Chen
(74) *Attorney, Agent, or Firm* — Kunzler Bean & Adamson

(57) ABSTRACT

One semiconductor device includes first to fourth wirings disposed within a prescribed interval in a first direction, extending in a second direction, and arranged at a first pitch in the first direction, first to third lead-out wirings disposed within the prescribed interval in the first direction, extending in the second direction, and arranged at a second pitch in the first direction, a bridge part disposed between the first lead-out wiring, and the second lead-out wiring, and connected to the first lead-out wiring, and the second lead-out wiring, a first contact part in contact with at least one part of the bridge part, and a second contact part in contact with the third lead-out wiring. One of either the first lead-out wiring, or the second lead-out wiring is connected to the second wiring, and the third lead-out wiring is connected to the fourth wiring.

4 Claims, 10 Drawing Sheets

(51) Int. Cl.
*H01L 21/027* (2006.01)
*H01L 21/033* (2006.01)

(58) Field of Classification Search
CPC . H01L 27/11519; H01L 27/0207; H01L 24/06
USPC .... 257/773, 786, E21.595, E23.01, E23.151
See application file for complete search history.

(56) References Cited

U.S. PATENT DOCUMENTS

| | | | |
|---|---|---|---|
| 8,667,443 B2* | 3/2014 | Smayling | G06F 17/5068 |
| | | | 716/119 |
| 2002/0160279 A1 | 10/2002 | Kotani et al. | |
| 2005/0009312 A1* | 1/2005 | Butt | G06F 17/5068 |
| | | | 438/587 |
| 2006/0273405 A1* | 12/2006 | Sekiguchi | G03F 1/36 |
| | | | 257/390 |
| 2007/0028205 A1 | 2/2007 | Nakano et al. | |
| 2010/0314771 A1 | 12/2010 | Hosomura et al. | |
| 2011/0117745 A1 | 5/2011 | Sato et al. | |

\* cited by examiner

[Fig. 1]
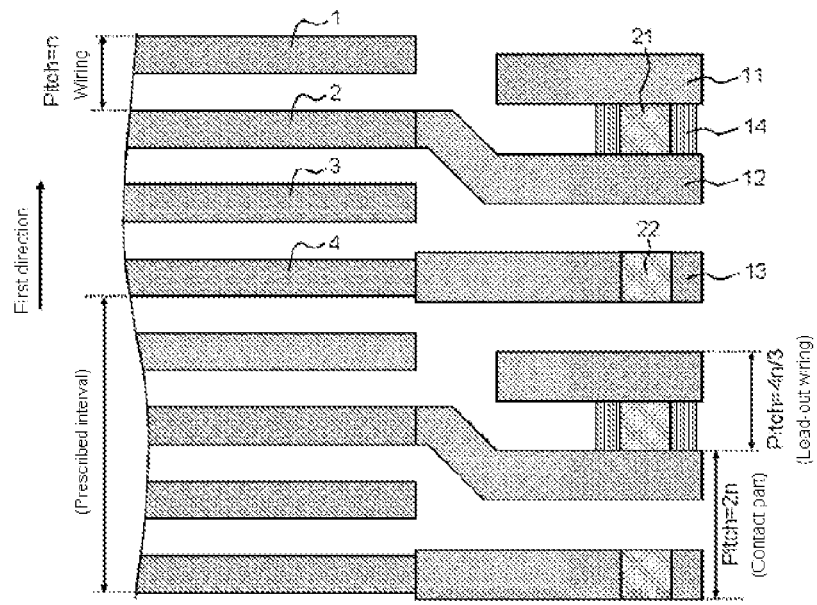
[Fig. 2]
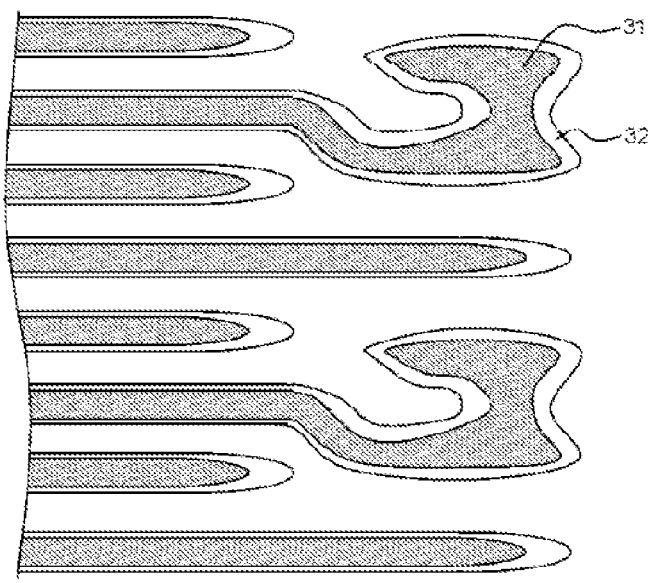

[Fig. 3]
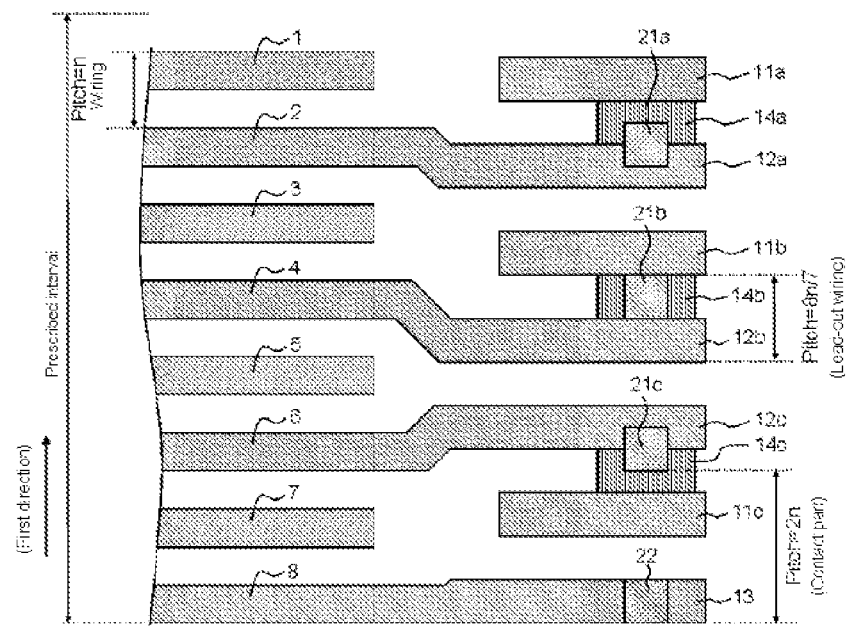
[Fig. 4]
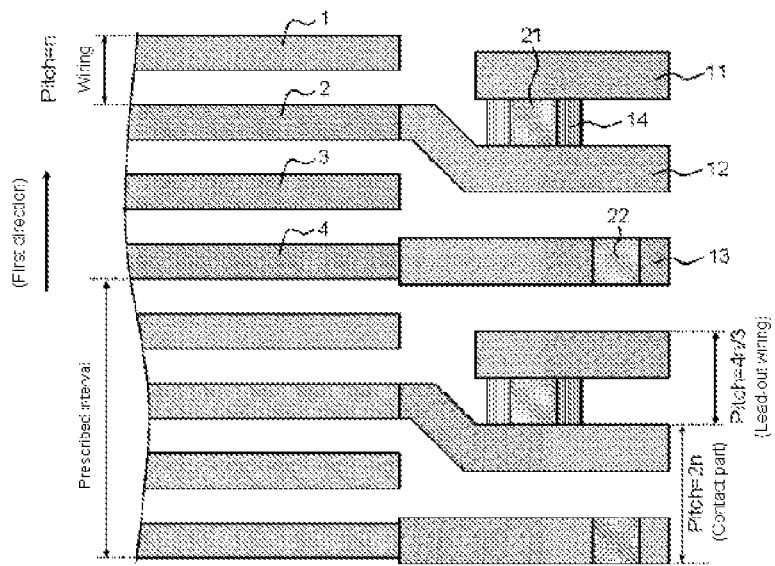

[Fig. 5]
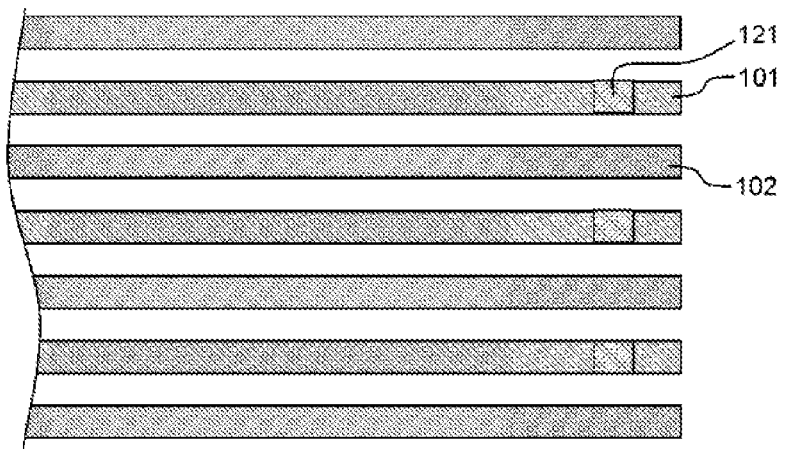
BACKGROUND ART
[Fig. 6]
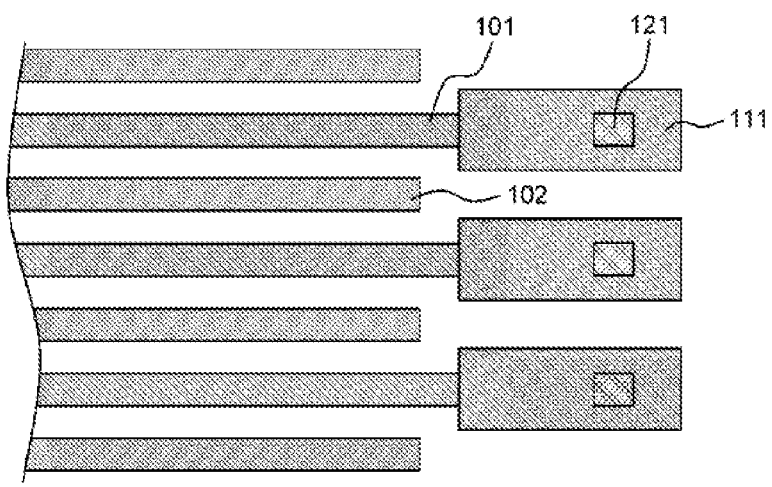
BACKGROUND ART

[Fig. 7]
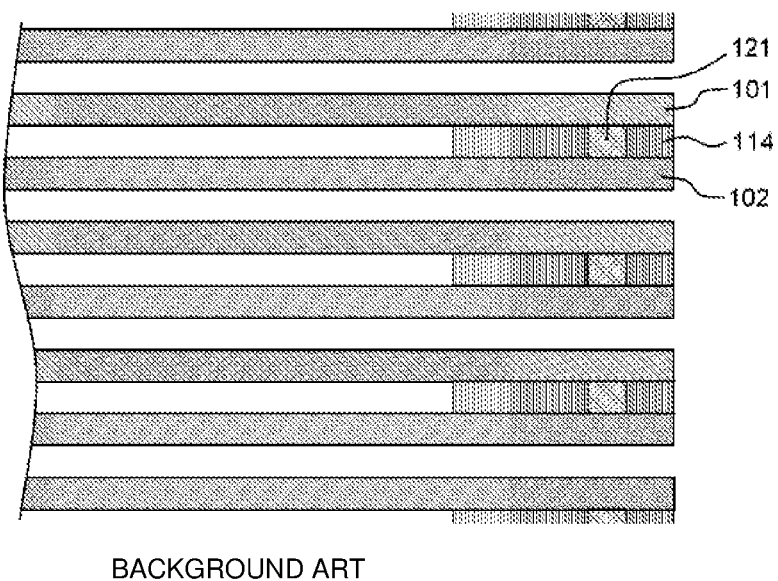
BACKGROUND ART
[Fig. 8]
[Nominal condition]
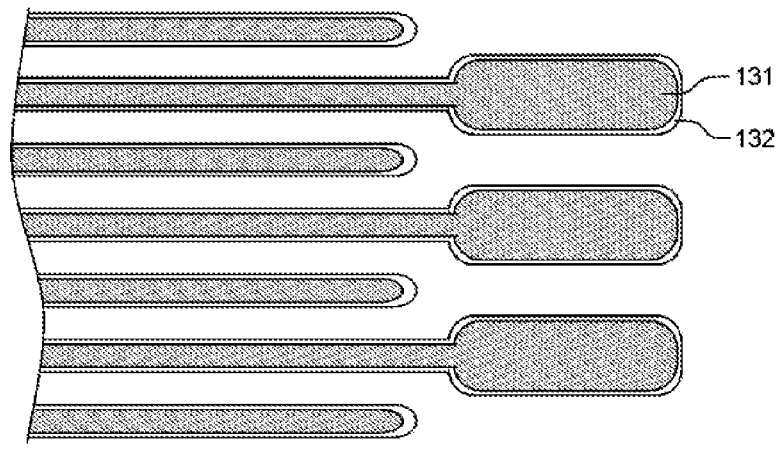
BACKGROUND ART

[Fig. 9]
[Defocusing condition]
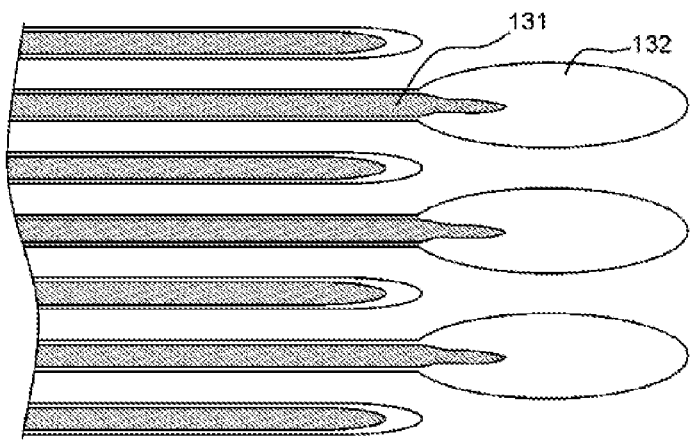
BACKGROUND ART
[Fig. 10]
[Illumination shape A]
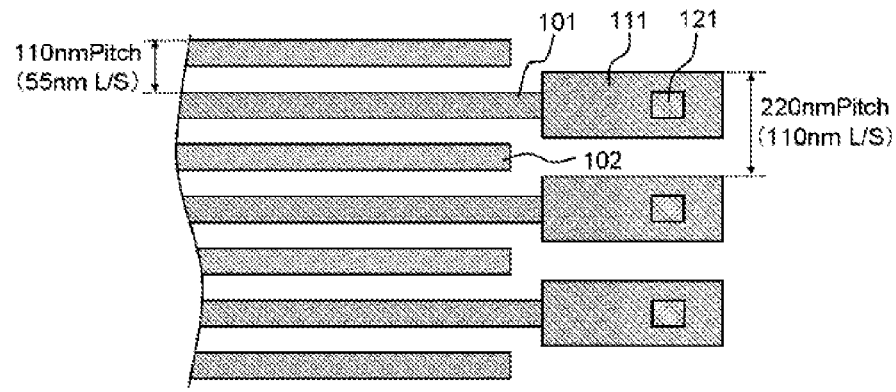
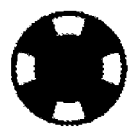
NA=1.05, σ = 0.94/0.58
Cross Pole 40deg open
BACKGROUND ART

[Fig. 11]
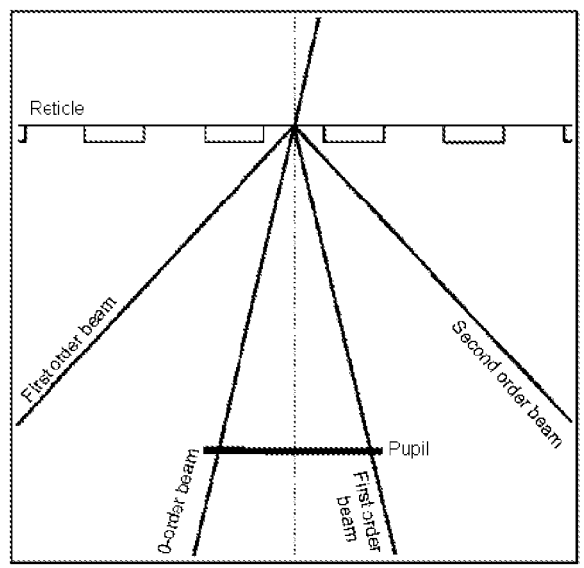
BACKGROUND ART
[Fig. 12]
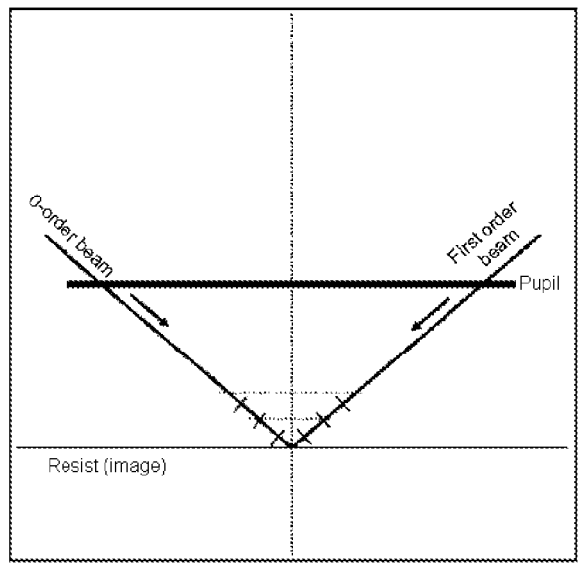
BACKGROUND ART

[Fig. 13]
[110 nmL/S diffraction pattern in the case of illumination shape A]
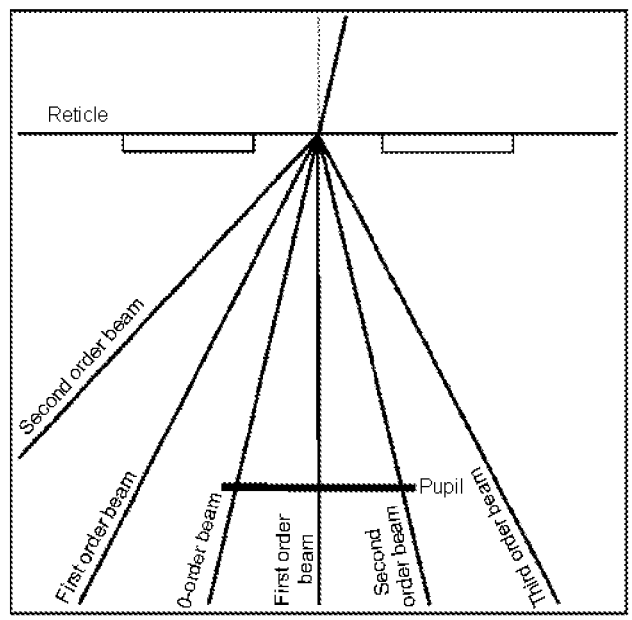
BACKGROUND ART
[Fig. 14]
[110 nmL/S focused image in the case of illumination shape A]
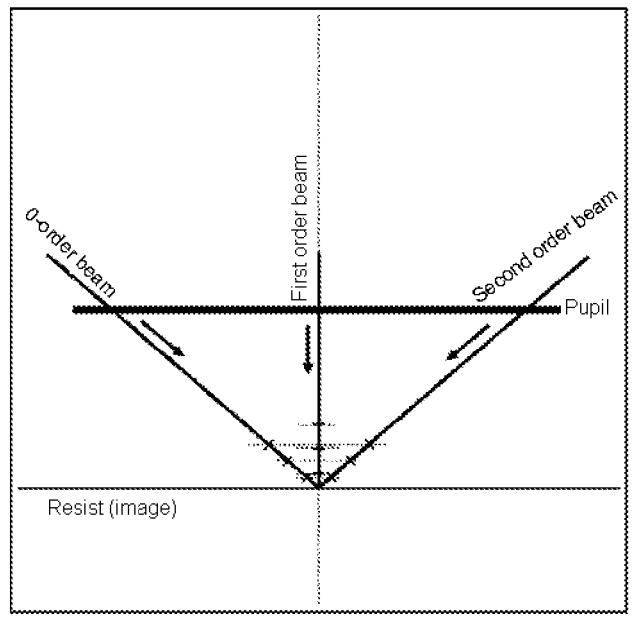
BACKGROUND ART

[Fig. 15]
[Illumination shape B]
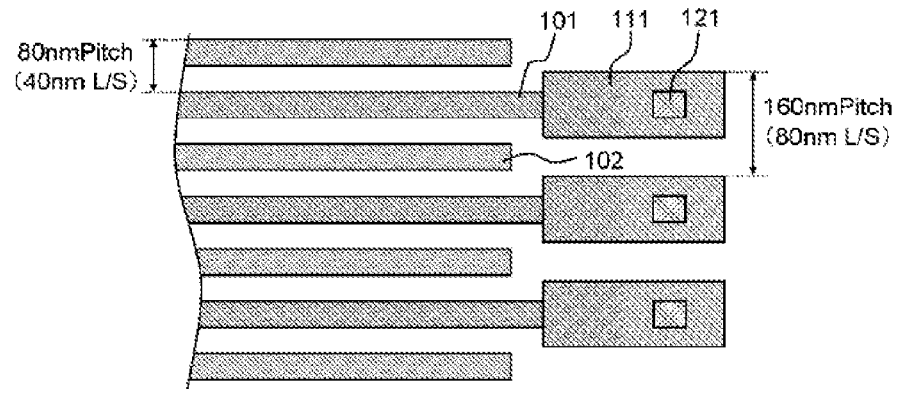
BACKGROUND ART
[Fig. 16]
[55 nmL/S focused image in the case of illumination shape B]
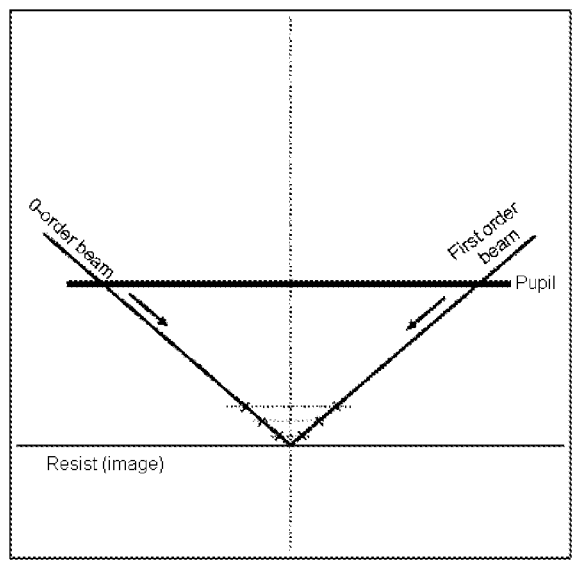
BACKGROUND ART

[Fig. 17]
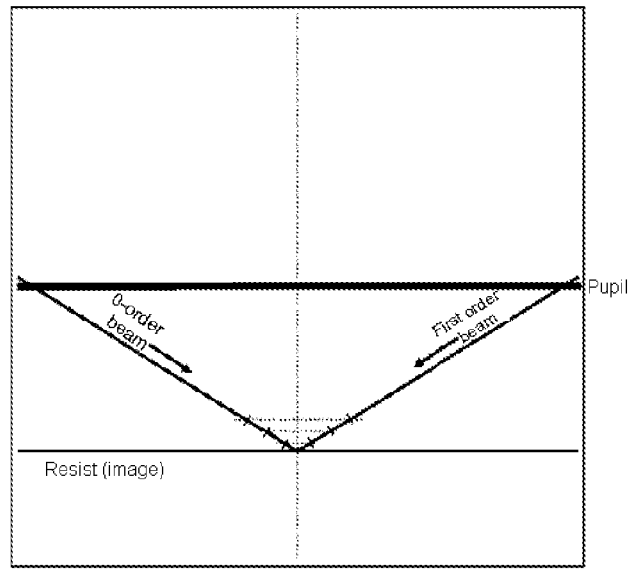
BACKGROUND ART
[Fig. 18]
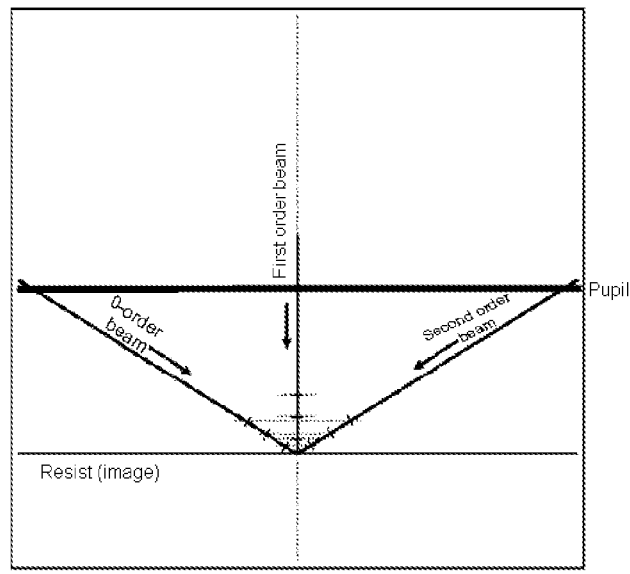
BACKGROUND ART

[Fig. 19]
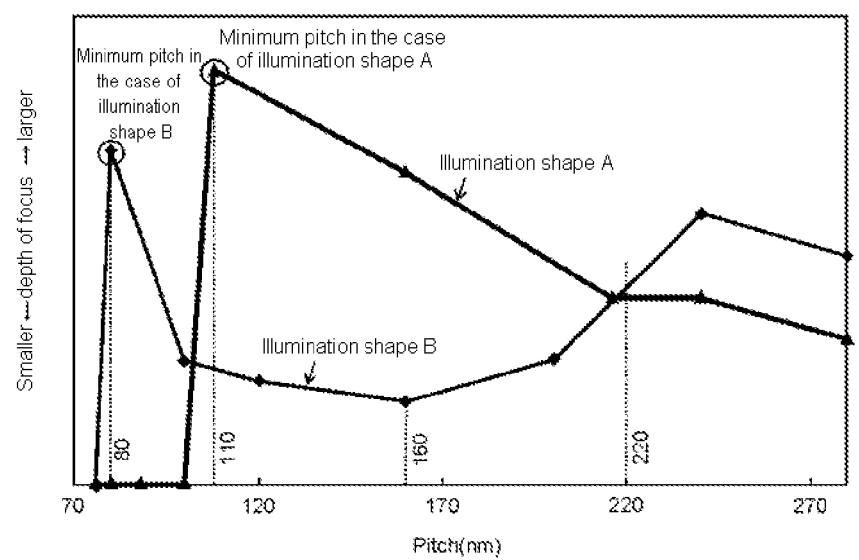
BACKGROUND ART

SEMICONDUCTOR DEVICE HAVING A REDUCED PITCH BETWEEN LEAD-OUT WIRINGS

TECHNICAL FIELD

Details of Related Applications

The present invention claims priority from: Japanese Patent Application Number 2013-081409 (filed on Apr. 9, 2013), the entire disclosure of which application is incorporated in the present specification by way of reference.

The present invention relates to a semiconductor device and in particular relates to a semiconductor device having a layout pattern of wiring that is electrically connected with a contact part.

TECHNICAL BACKGROUND

In the lithographic technique of manufacturing semiconductor devices, reduction of the optical pitch of the contact hole pattern tends to be more difficult to achieve than in the case of the wiring pattern: typically when providing a contact part 121 on a periodic pattern such as that of wirings 101, 102 of FIG. 5, the contact part connected therewith is constituted with a pitch of twice that of the wirings 101, 102 in question. However, with increasing progress in miniaturization of wiring patterns, if contact parts are merely arranged at intervals of alternate wirings, the contact part may sometimes deviate from the wiring pattern, resulting in the problems of increased contact resistance or short-circuiting of wirings adjacent to the contact part.

Accordingly, in order to solve such problems, in the prior art, as shown in FIG. 6, the end edge portion of the wiring 102, of the adjacent wirings, where no contact part 121 was connected was removed and a lead-out wiring part 111 where the end edge portion of the wiring 101, which is connected with the contact part 121, was thicker was provided, the contact part 121 being arranged at this lead-out wiring part 111. In this way, deviation of the contact part was avoided and short-circuiting was avoided by concomitantly increasing the wiring separation by providing a margin in regard to the pitch of the wirings 101, 102 (see for example Patent Reference 1).

Also, in the case where the one side of adjacent wirings 101, 102 should be at the same potential, bridge portion 114 were provided to connect such end edge portions of adjacent wirings 101, 102 of the same potential, and a contact part 121 was arranged at the bridge portion 114 in question: in this way, deviation of the contact part from the wiring and short-circuiting between wirings 101 and 102 was avoided (see for example Patent Reference 2).

PATENT REFERENCES

Patent Reference 1: Laid-open Japanese Patent Application 2002-328460

Patent Reference 2: Laid-open Japanese Patent Application H 11-150243

OUTLINE OF THE INVENTION

Problem that the Invention is Intended to Solve

The following analysis is provided by the inventor of the present application

However, when, in the lithographic technique, higher NA (numerical aperture) and higher σ (coherence factor: numerical aperture of an illumination optical system viewed from the pupil of a projection optical system/numerical aperture of the projection optical system viewed from the pupil of the projection optical system) are employed, with further miniaturization of the wiring pattern, it becomes essential to employ illumination such as cross-pole illumination.

Recently, wirings are being drawn with a pitch that is close to the limit of resolution and attempts have been made to provide contact parts 121 with double pitch as in FIG. 6. In these circumstances, although, under nominal conditions, resolution as in FIG. 8 is achieved (resolution portion 131) in all portions of the wiring (101, 102 in FIG. 6) as well as in the portion corresponding to the lead-out wiring part (111 in FIG. 6), under defocusing conditions, resist loss as in FIG. 9 becomes significant, resulting in a degraded depth of focus portion 132 being produced, in which the depth of focus of the portion corresponding to the lead-out wiring part (111 in FIG. 6) is severely degraded (i.e. diminished). Since, under defocusing conditions, there is little resist residue, the probability of pattern erasure in the etching process is increased. This is because 3-beam flux interference (3-beam wave interference) is produced when the lens peripheral zone is employed. Details are given below.

Conventionally, to achieve the illumination required for resolution of a minimum pitch of 110 nm (resolution 55 nmL/S: L/S=Line and Space), a liquid-immersion exposure apparatus having a moderate aperture (NA), giving an illumination shape A (NA=1.05, σ=0.94/0.58, cross-pole=40 deg open) as shown in FIG. 10 was satisfactory. As shown in FIG. 11, the pupil of such an apparatus passes a 55 nmL/S diffraction pattern comprising the 0-order beam and first-order beam only and is imaged with 2-beam flux interference at a resist surface as shown in FIG. 12. With 2-beam flux interference, the phase is the same in the resist depth direction, so high DOF (Depth of Focus) can be obtained. In contrast, in the case of 220 nm pitch (resolution 110 nmL/S), as shown in FIG. 13, the pupil surface passes the 0-order beam, first-order beam and second-order beam, and the pattern is imaged with 3-beam flux interference on the resist surface, as shown in FIG. 14. In the case of 3-beam flux interference, the phase difference with light coming from the middle of the pupil is considerably different in the depth direction, resulting in mutual cancelling-out, with the result that the DOF becomes small. To avoid double-pitch patterning, the phase difference is made the maximum (it is presupposed that illumination is optimized for minimum pitch).

However, with a minimum pitch of about 110 nm pitch, it is possible to achieve a large difference, with the inside σ being 0.58, compared with an outside σ of 0.94 (coherence factor), so light is effectively admitted even at 220 nm pitch: consequently, although the DOF was weak, a large drop could be avoided.

When, with further miniaturization, the minimum pitch becomes 80 nm pitch (resolution 40 nmL/S), the illumination required for resolution assumes the illumination shape B shown in FIG. 15 (NA=1.35, σ=0.94/0.84, cross-pole=40 deg.open) i.e. high NA and high σ, even the inside σ being 0.84. With such illumination, the angle of incidence onto the resist becomes large, as shown in FIG. 17 (the difference can be seen in comparison with the 55 nmL/S of FIG. 15). In such a condition, when 160 nm pitch (resolution 80 nmL/S) is exposed, as shown in FIG. 18, phase difference offset on the resist becomes extremely large, so scarcely any DOF can be obtained. Also, since 80 nm pitch is to be resolved, it is not possible to widen the difference with regard to the outside σ by reducing the inside σ, so a large drop in depth of focus in the region in the vicinity of a minimum pitch of 1.5 times to 2.3 times cannot be avoided.

The graph of FIG. 19 shows an investigation, using a simulation, of pattern DOF, altering the pitch, with illumination respectively individually optimized as that necessary for resolution with minimum pitch of 80 nm and 110 nm respectively. The mask was adjusted such that the simulation CD (Critical Dimension) was 1:1. The simulation was performed with an optical image and a threshold value was selected such that the simulation CD was 1:1 when the minimum pitch mask had an L/S of 1:1. In the case of a minimum pitch of 110 nm, the DOF satisfies the specification even for double pitch of 220 nm. In contrast, in the case of minimum pitch of 80 nm, for double pitch of 160 nm, the worst results were obtained (meaning that the situation could not be dealt with by conventional techniques). The pattern was therefore drawn with strict pitch. With the illumination shape B, there is a region of extremely small depth of focus, centered on the vicinity of double pitch (160 nm) of the minimum pitch.

As described above, conventionally, with miniaturization of the wiring pattern, securing depth of pitch by the techniques disclosed in Patent References 1 and 2 became difficult, when higher resolution was sought by using a combination of high lens NA and an illumination shape employing the peripheral part of the light source.

Means for Solving the Problem

According to a first aspect of the present invention, in a semiconductor device, there are provided: four, namely, first to fourth wirings, which are disposed within a prescribed interval in a first direction, extend in a second direction intersecting with said first direction, and are arranged with a first pitch in said first direction; three, namely, first to third lead-out wirings, which are disposed within said prescribed interval in said first direction, extend in said second direction, and are arranged with a second pitch in said first direction, in a region that is adjacent to the end edge portions of said first to fourth wirings; a bridge part which is disposed between said first lead-out wiring and said second lead-out wiring and is connected with said first lead-out wiring and said second lead-out wiring; a first contact part which is in contact with at least one part of said bridge part; and a second contact part which is in contact with said third lead-out wiring; wherein one of either said first lead-out wiring or said second lead-out wiring is connected with said second wiring and said third lead-out wiring is connected with said fourth wiring.

According to a second aspect of the present invention, in a semiconductor device, there are provided: eight, namely, first to eighth wirings, which are disposed within a prescribed interval in a first direction, extend in a second direction intersecting with said first direction, and are arranged with a first pitch in said first direction; seven, namely, first to seventh lead-out wirings, which are disposed within said prescribed interval in said first direction, extend in said second direction, and are arranged with a second pitch in said first direction, in a region that is adjacent to the end edge portions of said first to eighth wirings; a first bridge part which is disposed between said first lead-out wiring and said second lead-out wiring and is connected with said first lead-out wiring and said second lead-out wiring; a second bridge part which is disposed between said third lead-out wiring and said fourth lead-out wiring and is connected with said third lead-out wiring and said fourth lead-out wiring; a third bridge part which is disposed between said fifth lead-out wiring and said sixth lead-out wiring and is connected with said fifth lead-out wiring and said sixth lead-out wiring; a first contact part which is in contact with at least one part of said first bridge part; a second contact part which is in contact with at least one part of said second bridge part; a third contact part which is in contact with at least one part of said third bridge part; and a fourth contact part which is in contact with said eighth lead-out wiring; wherein one of either said first lead-out wiring or said second lead-out wiring is connected with said second wiring and one of either said third lead-out wiring or said fourth lead-out wiring is connected with said fourth wiring and one of either said fifth lead-out wiring or said sixth lead-out wiring is connected with said sixth wiring and said seventh lead-out wiring is connected with said eighth wiring.

Beneficial Effect of the Invention

With the present invention, a greater depth of focus can be achieved with a combination of NA exceeding 1 produced by liquid immersion and an illumination shape such as for example dipole and cross-pole, employing the peripheral part of a light source.

BRIEF DESCRIPTION OF THE DRAWINGS

FIG. 1 is a plan view showing diagrammatically the layout pattern of the wiring of a semiconductor device according to Embodiment 1 of the present invention.

FIG. 2 is a plan view showing diagrammatically a resolution pattern when the layout pattern of the wiring of a semiconductor device according to Embodiment 1 of the present invention is resolved under defocusing conditions.

FIG. 3 is a plan view showing diagrammatically the layout pattern of the wiring of a semiconductor device according to Embodiment 2 of the present invention.

FIG. 4 is a plan view showing diagrammatically the layout pattern of the wiring of a semiconductor device according to Embodiment 3 of the present invention.

FIG. 5 is a plan view showing diagrammatically the layout pattern of the wiring when a contact part is disposed with double pitch with respect to the wiring in a semiconductor device according to Prior Art Example 1.

FIG. 6 is a plan view showing diagrammatically the layout pattern of the wiring when a contact part is disposed with double pitch with respect to the wiring in a semiconductor device according to Prior Art Example 2.

FIG. 7 is a plan view showing diagrammatically the layout pattern of the wiring when a contact part is disposed with double pitch with respect to the wiring in a semiconductor device according to Prior Art Example 3.

FIG. 8 is a plan view showing diagrammatically the resolution pattern when the layout pattern of the wiring of a semiconductor device according to Prior Art Example 2 is resolved under nominal conditions.

FIG. 9 is a plan view showing diagrammatically the resolution pattern when the layout pattern of the wiring of a semiconductor device according to Prior Art Example 2 is resolved under defocusing conditions.

FIG. 10 is a view showing the condition relating to illumination shape A.

FIG. 11 is a view showing diagrammatically a 55 nmL/S diffraction pattern in the case of illumination shape A.

FIG. 12 is a view showing diagrammatically a 55 nmL/S focused image in the case of illumination shape A.

FIG. 13 is a view showing diagrammatically a 110 nmL/S diffraction pattern in the case of illumination shape A.

FIG. 14 is a view showing diagrammatically a 110 nmL/S focused image in the case of illumination pattern A.

FIG. 15 is a view showing the condition relating to illumination shape B.

FIG. 16 is a view showing diagrammatically a 55 nmL/S focused image in the case of illumination shape B.

FIG. 17 is a view showing diagrammatically a 40 nmL/S focused image in the case of illumination shape B.

FIG. 18 is a view showing diagrammatically a 80 nmL/S focused image in the case of the illumination shape B.

FIG. 19 is a graph showing an investigation, using a simulation, of pattern DOF, altering the pitch, with illumination respectively individually optimized as that necessary for resolution with minimum pitch of 80 nm and 110 nm respectively.

MODES FOR PUTTING THE INVENTION INTO PRACTICE

Embodiment 1

A semiconductor device according to Embodiment 1 of the present invention is described below with reference to the drawings. FIG. 1 is a plan view showing diagrammatically the layout pattern of the wiring of a semiconductor device according to Embodiment 1 of the present invention. FIG. 2 is a plan view showing diagrammatically a resolution pattern when the layout pattern of the wiring of a semiconductor device according to Embodiment 1 of the present invention is resolved under defocusing conditions.

Referring to FIG. 1, in this semiconductor device, in a wiring layer of multi-layer wiring structure, in which wirings and insulating layers are laminated, four wirings 1 to 4 are arranged in order from the top of FIG. 1 within a prescribed interval (4n times pitch) in a first direction, and the arrangement of wirings 1 to 4 is repeated. Wirings 1 to 4 extend in a direction at right angles to the first direction and have respectively the same wiring width; adjacent wirings 1 to 4 are mutually separated with an interval that is the same as the width of the wirings in question. Wirings 1 to 4 collectively are disposed with a pitch of n times that of adjacent wirings.

In the region on the right-hand side of the end edge portion of the wirings 1 to 4 in FIG. 1, three lead-out wiring parts 11 to 13 that are arranged with a pitch of 4n/3 times are disposed within the prescribed interval in the first direction. These lead-out wiring parts 11 to 13 extend in a direction at right angles with respect to the first direction and have respectively the same wiring width (4/3 times the wiring width of the wirings 1 to 4), being mutually separated from adjacent lead-out wiring parts 11 to 13, with the same interval as the wiring width in question.

A bridge part 14 that contacts lead-out wiring parts 11, 12 is disposed in a prescribed position between the lead-out wiring parts 11, 12. A contact part 21 that contacts at least part of the bridge part 14 is disposed in a prescribed position in the region of the bridge part 14. Also, a contact part 22 that contacts the lead-out wiring part 13 is disposed in a prescribed position in the region of the lead-out wiring part 13. The interval between the contact part 21 and the contact part 22 is half (2n times pitch) the prescribed interval (4n times pitch) in the first direction.

The lead-out wiring part 11 is not connected with any wiring. The lead-out wiring part 12 is connected with the wiring 2 in inclined fashion. It should be noted that while the lead-out wiring part 11 is connected with the wiring 2, the lead-out wiring part 12 could be arranged not to be connected with any wiring. The lead-out wiring part 13 is connected with the wiring 4.

With Embodiment 1, phase offset in three-beam flux interference becomes small, so the depth of focus is increased. In other words, greater depth of focus can be achieved in a combination of NA exceeding 1 produced by liquid immersion with illumination shape, such as for example dipole or cross-pole, using the peripheral part of the light source. Consequently, even under defocusing conditions, all of the portion (resolution portion 31) corresponding to the wirings 1 to 4 and the lead-out wiring parts 11 to 13 is resolved (see FIG. 2), and the region where the residual resist film has sufficient thickness is of ample size, thereby improving ability to withstand etching; albeit pattern deformation caused by focus offset becomes large.

Embodiment 2

A semiconductor device according to Embodiment 2 of the present invention is described below with reference to the drawings. FIG. 3 is a plan view showing diagrammatically the layout pattern of the wiring of a semiconductor device according to Embodiment 2 of the present invention.

Embodiment 2 is a modification of Embodiment 1, in which lead-out wiring parts 11a, 12a, 11b, 12b, 12c, 11c, and 13 are arranged with 8/7 times pitch.

Referring to FIG. 3, in a semiconductor device, in a wiring layer of multi-layer wiring structure in which wirings and insulating layers are laminated, within a prescribed interval (8n times pitch) in a first direction, eight wirings 1 to 8 are disposed in order from the top of FIG. 3; the arrangement of the wirings 1 to 8 is repeated. The wirings 1 to 8 extend in a direction at right angles to the first direction and are respectively of the same wiring width, adjacent wirings 1 to 8 being mutually separated with an interval that is the same as the wiring width in question. The wirings 1 to 8 are collectively arranged with n times the pitch of adjacent wirings.

In the region on the right-hand side of the end edge portion of the wirings 1 to 8 in FIG. 3, there are disposed seven lead-out wiring parts 11a, 12a, 11b, 12b, 12c, 11c and 13, which are arranged with 8n/7 times pitch within the prescribed interval in the first direction. The lead-out wiring parts 11a, 12a, 11b, 12b, 12c, 11c and 13 are respectively of the same wiring width (8/7 times the wiring width of the wirings 1 to 8), extend in a direction at right angles to the first direction and are mutually separated from adjacent lead-out wiring parts 11a, 12a, 11b, 12b, 12c, 11c and 13 by the same interval as the wiring width in question.

In respective prescribed positions between the lead-out wiring parts 11a, 12a, between the lead-out wiring parts 11b and 12b and between the lead-out wiring parts 12c and 11c, bridge parts 14a, 14b and 14c are arranged that are connected with the corresponding lead-out wiring. In a prescribed position of the region in the vicinity of the boundary of the bridge part 14a and the lead-out wiring part 12a, there is disposed a contact part 21a that contacts at least part of the corresponding bridge part 14a and lead-out wiring part 12a. Also, in a prescribed position of the region of the bridge part 14b, there is disposed a contact part 21b that contacts at least part of the bridge part 14b. Also, in a prescribed position of the region in the vicinity of the boundary of the lead-out wiring part 12c and the bridge part 14c, there is disposed a contact part 21c that contacts at least part of the corresponding lead-out wiring part 12c and the bridge part 14c. Also, in a prescribed position of the region of the lead-out wiring part 13, there is disposed a contact part 22 that contacts the lead-out wiring part 13. The pitch between adjacent contact parts 21a, 21b, 21c and 22 is 1/4 (2n times pitch) of the prescribed interval (8n times pitch) in the first direction.

The lead-out wiring parts 11a, 11b and 11c are not connected with any wiring. The lead-out wiring parts 12a, 12b and 12c are connected in inclined fashion with the corresponding wirings 2, 4 and 6. It should be noted that, while the lead-out wiring parts 11a, 11 b and 11c are connected with the corresponding wirings 2, 4 and 6, the lead-out wiring parts 12a, 12b and 12c need not be connected with any wiring. The lead-out wiring part 13 is connected with the wiring 8.

With Embodiment 2, the same beneficial effects as in the case of Embodiment 1 are presented.

Embodiment 3

A semiconductor device according to Embodiment 3 of the present invention is described below with reference to the drawings. FIG. 4 is a plan view showing diagrammatically the layout pattern of the wiring of the semiconductor device according to Embodiment 3 of the present invention.

Embodiment 3 is a modification of Embodiment 1, in which the bridge parts 14 between the lead-out wiring parts 11, 12 are arranged closer to the wirings 1 to 4 than the contact parts 22. Other aspects of the construction are the same as in the case of Embodiment 1.

The same beneficial effects as in the case of Embodiment 1 are presented by Embodiment 3.

It should be noted that, in the present application, where reference numerals are provided in the drawings, these serve merely for assisting comprehension and are not intended to be restricted to the illustrated embodiments.

Also, within the compass of the entire disclosure (including the claims and drawings) of the present invention, further modifications or adjustments may be made to the embodiments or modes of implementation in accordance with the basic technical concept thereof. Also, within the compass of the entire disclosure of the present invention, many combinations or selections may be made of the various elements of the disclosure (including elements of the claims, elements of the modes of implementation or embodiments, or elements of the drawings and so on). In other words, the present invention of course includes various types of modification or revision that can be made by persons skilled in the art based on the entire disclosure and technical concept including the claims and the drawings.

(Addendum)

According to a first aspect of the present invention, in a semiconductor device, there are provided: four, namely, first to fourth wirings, which are disposed within a prescribed interval in a first direction, extend in a second direction intersecting with said first direction, and are arranged with a first pitch in said first direction; three, namely, first to third lead-out wirings, which are disposed within said prescribed interval in said first direction, extend in said second direction, and are arranged with a second pitch in said first direction, in a region that is adjacent to the end edge portions of said first to fourth wirings; a bridge part which is disposed between said first lead-out wiring and said second lead-out wiring and is connected with said first lead-out wiring and said second lead-out wiring; a first contact part which is in contact with at least one part of said bridge part; and a second contact part which is in contact with said third lead-out wiring; wherein one of either said first lead-out wiring or said second lead-out wiring is connected with said second wiring and said third lead-out wiring is connected with said fourth wiring.

In said semiconductor device according to the present invention, the other of said first lead-out wiring and said second lead-out wiring is not connected with any of said first to fourth wirings.

In said semiconductor device according to the present invention, said first contact part and said second contact part are arranged with a third pitch in said first direction, said third pitch being twice said first pitch.

In said semiconductor device according to the present invention, said second pitch is 4/3 times said first pitch.

In said semiconductor device according to the present invention, said prescribed interval is four times said first pitch.

In said semiconductor device according to the present invention, said second contact part is disposed on a line in said first direction passing through the center of said first contact part.

In said semiconductor device according to the present invention, said first contact part and said bridge part are disposed in positions offset in said second direction with respect to said second contact part.

According to a second aspect of the present invention, in a semiconductor device, there are provided: eight, namely, first to eighth wirings, which are disposed within a prescribed interval in a first direction, extend in a second direction intersecting with said first direction, and are arranged with a first pitch in said first direction; seven, namely, first to seventh lead-out wirings, which are disposed within said prescribed interval in said first direction, extend in said second direction, and are arranged with a second pitch in said first direction, in a region that is adjacent to the end edge portions of said first to eighth wirings; a first bridge part which is disposed between said first lead-out wiring and said second lead-out wiring and is connected with said first lead-out wiring and said second lead-out wiring; a second bridge part which is disposed between said third lead-out wiring and said fourth lead-out wiring and is connected with said third lead-out wiring and said fourth lead-out wiring; a third bridge part which is disposed between said fifth lead-out wiring and said sixth lead-out wiring and is connected with said fifth lead-out wiring and said sixth lead-out wiring; a first contact part which is in contact with at least one part of said first bridge part; a second contact part which is in contact with at least one part of said second bridge part; a third contact part which is in contact with at least one part of said third bridge part; and a fourth contact part which is in contact with said eighth lead-out wiring; wherein one of either said first lead-out wiring or said second lead-out wiring is connected with said second wiring and one of either said third lead-out wiring or said fourth lead-out wiring is connected with said fourth wiring and one of either said fifth lead-out wiring or said sixth lead-out wiring is connected with said sixth wiring and said seventh lead-out wiring is connected with said eighth wiring.

In said semiconductor device according to the present invention, the other of said first lead-out wiring and said second lead-out wiring, and the other of said third lead-out wiring and said fourth lead-out wiring, and the other of said fifth lead-out wiring and said sixth lead-out wiring are not connected with any of said first to eighth wirings.

In said semiconductor device according to the present invention, said first to fourth contact parts are arranged with a third pitch in said first direction, said third pitch being twice said first pitch.

In said semiconductor device according to the present invention, said second pitch is 8/7 times said first pitch.

In said semiconductor device according to the present invention, said prescribed interval is eight times said first pitch.

In said semiconductor device according to the present invention, said second to fourth contact parts are disposed on a line in said first direction passing through the center of said first contact part.

EXPLANATION OF THE REFERENCE SYMBOLS 1 to 8, 101, 102 Wirings
11, 11a, 11b, 11c, 111 Lead-out wiring parts
12, 12a, 12b, 12c Lead-out wiring parts
13 Lead-out wiring parts
14, 14a, 14b, 14c Bridge parts
21, 21a, 21b, 21c, 22, 121 Contact parts
31 Resolution portion (portion where the residual photoresist film is sufficiently thick)
32 Portion of degraded depth of focus (portion where the residual photoresist film is thin)
131 Resolution portion (portion where the residual photoresist film is sufficiently thick)
132 Portion of degraded depth of focus (portion where the residual photoresist film is thin)

What is claimed is:

1. A semiconductor device comprising:
   first, second, third, and fourth wirings disposed in a same wiring level within a prescribed interval in a first direction, extending in a second direction intersecting with said first direction, and arranged with a first pitch in said first direction;
   first, second, and third lead-out wirings disposed in the same wiring level within said prescribed interval in said first direction, extending in said second direction, and arranged with a second pitch in said first direction, in a region that is adjacent to the end edge portions of said first to fourth wirings;
   a bridge part disposed in the same wiring level between said first lead-out wiring and said second lead-out wiring and connected with said first lead-out wiring and said second lead-out wiring;
   a first contact part in contact with at least one part of said bridge part; and
   a second contact part in contact with said third lead-out wiring;
   wherein one of either said first lead-out wiring or said second lead-out wiring is connected with said second wiring, and said third lead-out wiring is connected with said fourth wiring, and wherein the second pitch is larger than the first pitch.

2. The semiconductor device as claimed in claim 1, wherein the other of said first lead-out wiring and said second lead-out wiring is not connected with any of said first to fourth wirings.

3. The semiconductor device as claimed in claim 1, wherein said first contact part and said second contact part are arranged with a third pitch in said first direction, said third pitch being twice said first pitch.

4. The semiconductor device as claimed in claim 1, wherein said first contact part and said bridge part are disposed in positions offset in said second direction with respect to said second contact part.

* * * * *